United States Patent [19]

Yamazaki

[11] Patent Number: 5,403,763
[45] Date of Patent: Apr. 4, 1995

[54] METHOD OF MANUFACTURING A VERTICAL CHANNEL FET

[75] Inventor: Shunpei Yamazaki, Tokyo, Japan

[73] Assignee: Semiconductor Energy Laboratory Co., Ltd., Kanagawa, Japan

[21] Appl. No.: 193,848

[22] Filed: Feb. 9, 1994

Related U.S. Application Data

[62] Division of Ser. No. 732,089, Jul. 18, 1991, Pat. No. 5,302,843.

[30] Foreign Application Priority Data

Jul. 26, 1990 [JP] Japan .................. 2-200303
Aug. 7, 1990 [JP] Japan .................. 2-210042

[51] Int. Cl.⁶ .......................... H01L 21/266
[52] U.S. Cl. ........................ 437/44; 437/35; 437/45
[58] Field of Search .......... 437/29, 30, 35, 41, 437/44, 45, 149, 150

[56] References Cited

U.S. PATENT DOCUMENTS

| | | | |
|---|---|---|---|
| 4,250,519 | 2/1981 | Mogi et al. | 257/302 |
| 4,554,570 | 11/1985 | Jastrzebski et al. | 257/331 |
| 4,649,406 | 3/1987 | Takemae et al. | 257/306 |
| 4,818,715 | 4/1989 | Chao | 437/44 |
| 4,819,043 | 4/1989 | Yazawa et al. | 257/344 |
| 4,845,539 | 7/1989 | Inoua | 257/302 |
| 4,937,641 | 6/1990 | Sunami et al. | 357/23.4 |
| 4,963,504 | 10/1990 | Huang | 437/44 |
| 5,047,812 | 9/1991 | Pfiester | 257/344 |
| 5,136,534 | 8/1992 | McDavid et al. | 257/295 |
| 5,181,088 | 1/1993 | Mikata et al. | 257/331 |

FOREIGN PATENT DOCUMENTS

| | | |
|---|---|---|
| 1-248557 | 10/1989 | Japan . |
| 1-293666 | 11/1989 | Japan . |
| 2-79475 | 3/1990 | Japan . |
| 2103879 | 2/1983 | United Kingdom . |

OTHER PUBLICATIONS

Mizuno et al., "High Speed and Highly Reliable Trench MOSFET with Dual Gate", Symp. VLSI Tech. Dig. (1988), pp. 23–24.

IEDM 11–14 Dec. 1988, pp. 222–225, San Francisco, Calif., U.S.; H. Takato et al.; "High Performance CMOS Surrounding Gate Transistor (SGT) for Ultra High Density LSIs".

*Primary Examiner*—Tom Thomas
*Assistant Examiner*—Chandra Chaudhari
*Attorney, Agent, or Firm*—Sixbey, Friedman, Leedom & Ferguson

[57] ABSTRACT

A field effect transistor is formed on a side surface of an elevation protruded from the upper surface of a substrate. A gate electrode is formed on the side surface with a gate insulating film therebetween. Source and drain regions are formed in the top of the elevation and the surface of the substrate adjacent to the elevation by ion implantation with the gate electrodes as a mask.

17 Claims, 8 Drawing Sheets

METHOD OF MANUFACTURING A VERTICAL CHANNEL FET

This is a divisional application of Ser. No. 07/732,089, now U.S. Pat. No. 5,302,843, filed Jul. 18, 1991.

BACKGROUND OF THE INVENTION

1. Field of the Invention

The present invention relates to a semiconductor device and a method of manufacturing the same and, more particularly to an improved technique suitable for ULSIs of the packing density ranging from 16M bits to 16G bits.

2. Description of the Prior Art

Figure 1A:
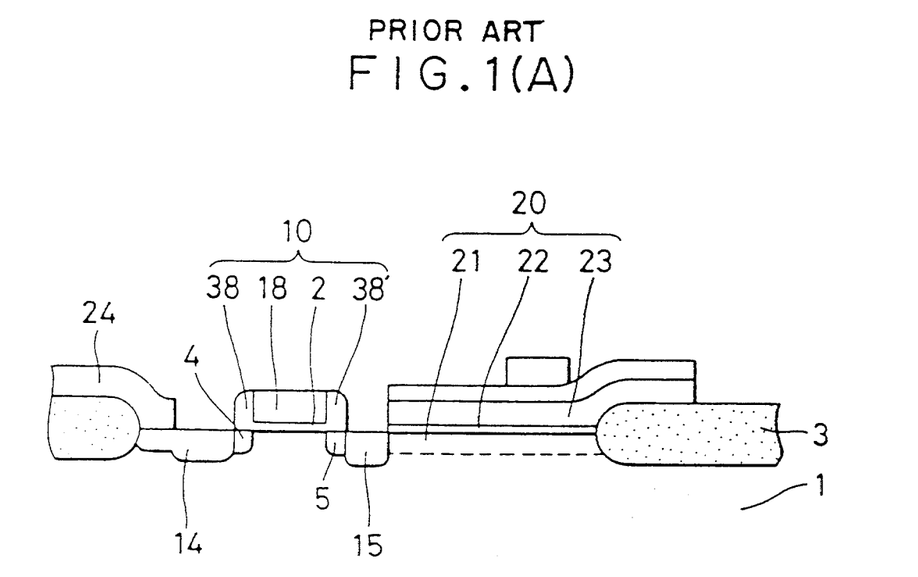
FIG. 1(A) is a cross sectional view showing a storage element of a prior art semiconductor memory.
Figure 1B:
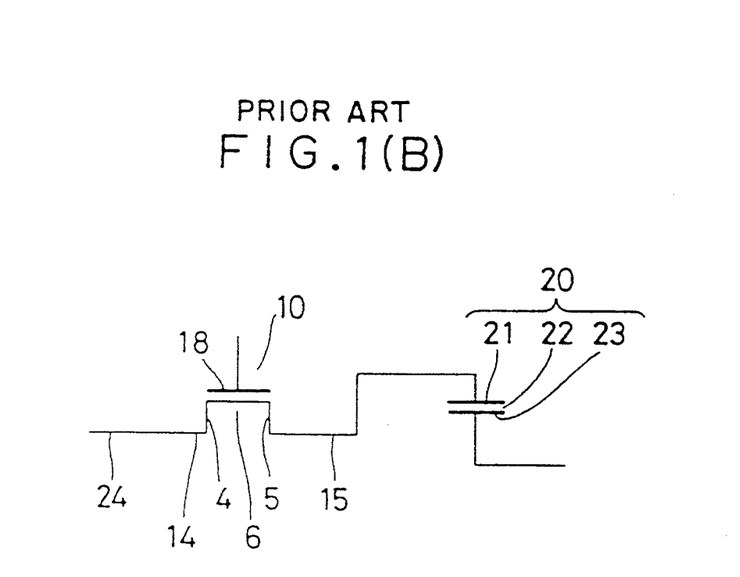
FIG. 1(B) is a circuit diagram showing an equivalent circuit of the storage element illustrated in FIG. 1(A).

An example of MIS FETs associated with capacitances is shown in FIG. 1 (A) to form one bit storage element of a semiconductor memory device. A semiconductor substrate 1 is partitioned by a field insulating film 3 into a number of active regions, only one of which is illustrated in the figure. An FET 10 formed within the active region of the substrate 1 comprises lightly doped source and drain regions 4 and 5 flanked respectively with heavily doped impurity regions 14 and 15 for facilitating formation of ohmic contact, a gate electrode 18 insulated from a channel region located between the source and the drain regions 4 and 5 by means of an insulating film 2. A capacitor 20 comprises an impurity semiconductor region 21 functioning as a first electrode and a polysilicon film 23 functioning as a second electrode insulated from the first electrode 21 by an intervening dielectric film 22. Numerals 38 and 38' in the figure designate shoulder portions 38 and 38' provided for the purpose of formation of the source and the drain regions 4 and 5 in such a dual structure. The corresponding circuit diagram of this structure is shown in FIG. 1(B), which constitutes a unit memory cell of 1 Tr/Cell DRAM.

Since the unit structure of this prior art is constructed in a one-dimmensional geometry, there is a limitation upon the packing density of the integration. More simple and effective structure is required for increasing the packing density.

BRIEF SUMMARY OF THE INVENTION

It is an object of the present invention to provide a gate insulated field effect transistor suitable for constituting VLSIs having high packing densities.

It is another object of the present invention to provide a semiconductor device utilizing such a gate insulated field effect transistor.

It is a further object of the present invention to provide a method of manufacturing gate insulated field effect transistors.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, an elevation is formed on a semiconductor substrate and flanked by a pair of triangular or rectangular gate electrodes in order to constitute a pair of vertical-lateral type field effect transistors. The channel regions of the transistors are formed on the opposed side surfaces of the elevation in the vertical direction by virtue of the pair of gate electrodes whereas the drain and source regions are formed on the upper surface of the elevation and principal surface of the substrate located just adjacent to the elevation in the lateral direction.

In accordance with an aspect of the present invention, a rectangular parallelepiped single crystalline elevation is used as the elevation and the orientation of the opposed side surfaces is selected to be in the (100) or equivalent plane of the crystalline structure of the parallelepiped elevation. This selection reduces formation of interface states due to positive charge generation caused by dangling bonds of silicon atoms. The orientation of the other opposed side surfaces perpendicular thereto are also selected to be in the (100) or equivalent plane of the crystalline structure of the parallelepiped elevation so that formation of parasitic channels is prevented. Contact holes of the order of 0.1 to 0.5 μm square can easily be opened above the source or drain regions provided in horizontal planes. The formation of such small holes is very difficult in the cases of source and drain regions formed in the vertical planes of the elevation. The channel regions slightly extend to the principal surface of the substrate just below the bottom of the gate electrodes. The source and drain regions are formed typically by ion implantation with the gate electrodes as a mask in a lateral or vertical direction. By this structure, one transistor can be formed within an area of 1 μm square to 10 μm square with the channel length decreased to 0.03 μm to 1 μm so that 16 Mega bits to 16 Giga bits ULSIs having frequency response speeds of 1 to 10 GHz can be manufactured without electron beam process.

Desirably, the drain and source regions are formed respectively in dual structures each comprising a lightly doped region and a heavily doped region, commonly called the LDD structure. The ends of the gate electrodes are positioned at the ends of the channel regions or slightly extend to the adjacent lightly doped regions but not to reach the heavily doped region beyond the lightly doped regions in order to avoid formation of offset structure of gate electrodes and facilitate manufacture.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 2A:
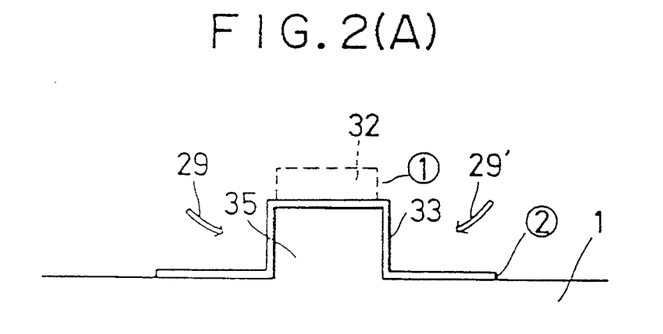
FIGS. 2(A) to 2(E) are cross sectional and plan views showing a manufacturing method of vertical channel FETs accordance with a first embodiment of the present invention.
Figure 2B:
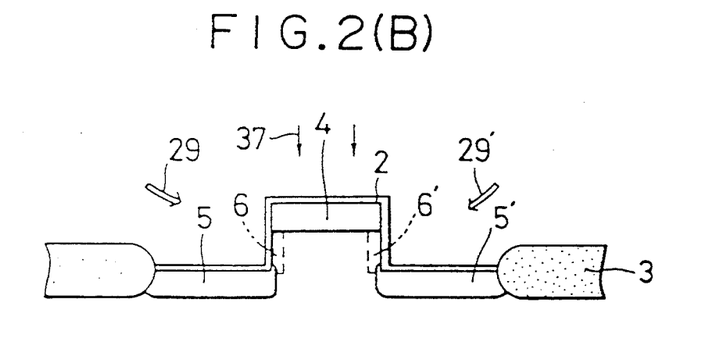
Figure 2C:
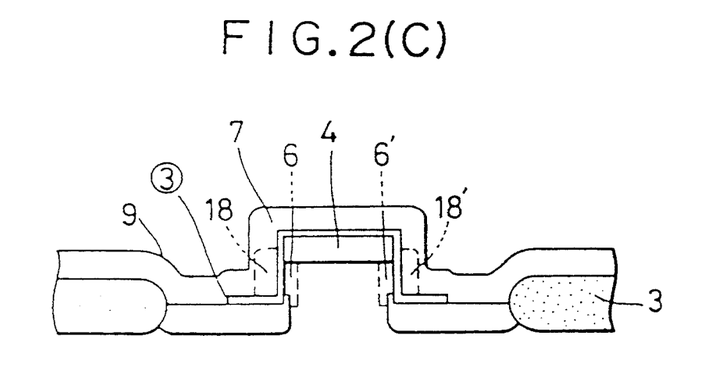
Figure 2D:
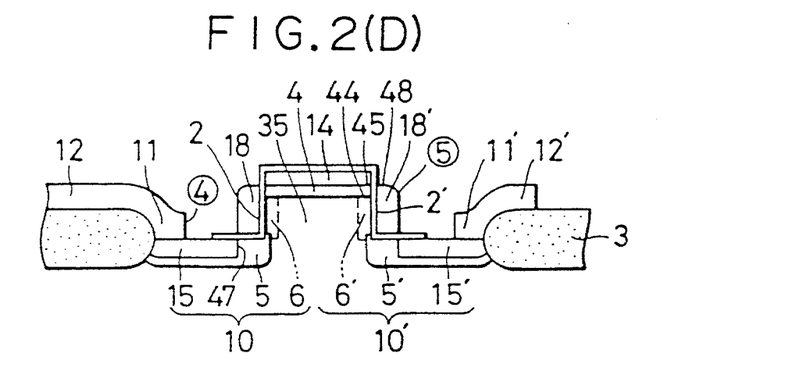
Figure 2E:
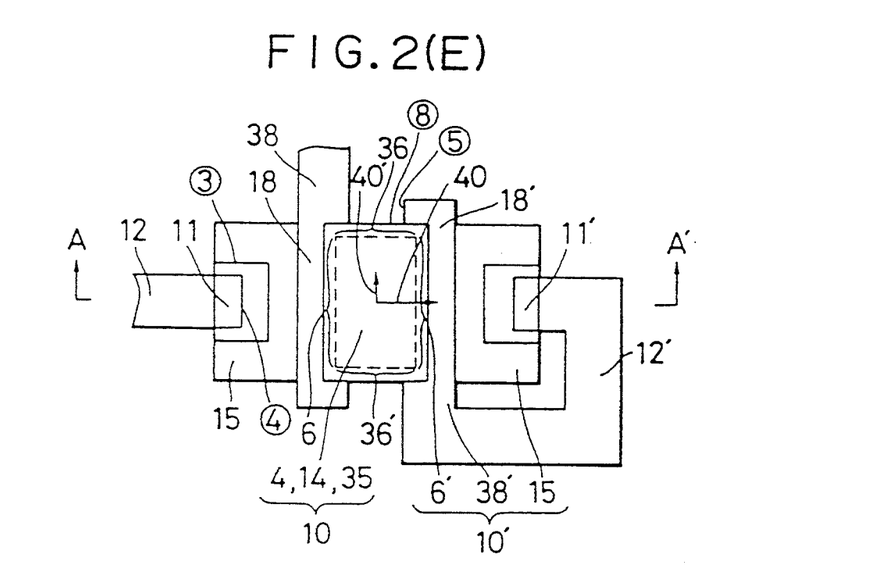

Referring now to FIGS. 2(A) through 2(D), which illustrate a first preferred embodiment of the invention, a manufacturing method for n-channel MIS FETs will be described. FIG. 2(E) shows a pair of completed FETs in a cross sectional view along A–A' line of FIG. 2(D).

A single crystalline p-type silicon semiconductor of 10 to 500 $\Omega$cm is used as a substrate 1. The orientation and dicing of the substrate have to be carried out in order that the principal surface thereof is parallel to the (001) plane of the crystalline structure. The tolerable angular displacement between the principal surface and the (001) plane is within ±10° in practice. A photoresist 32 is formed by the use of photomask ① on the substrate 1. The surface portion of the substrate 1 is partially removed by etching with the photoresist 32 as a mask in order to leave an elevation 35. The elevation is a parallelepiped having side surfaces parallel to the (100) and (010) planes and sharply extending downward from the edge of the upper surface thereof at 90°. For this reason, the etching has to be carried out anisotropically. The height of the elevation is 0.5 to 4 μm, for example, 1.5 μm.

By this orientation of the crystalline structure, the fixed electric charge density at the side surfaces can be decreased by up to 50% of the other crystalline planes such as the (011), (101) or (111) planes. The substrate 1 formed with the elevation 35 is coated with a silicon nitride film 33 of a thickness of about 0.1 μm. The silicon nitride film 33 can be replaced by another suitable film, capable of masking the underlying surfaces from the effects of oxidizing atmospheres, such as a silicon oxide film or a laminate film comprising a polycrystalline silicon film and a silicon nitride film. The silicon nitride film 33 is patterned by means of a second photomask ② as illustrated in FIG. 2(A). After doping with a p-type impurity for channel cut the surface region from which the silicon nitride film is removed, a field insulating film 3 of a thickness of 0.5 to 2 μm is buried in order to define active areas therebetween. The silicon nitride film 33 is removed and a silicon oxide film Z is formed instead.

Arsenic or phosphorus is introduced into the substrate by ion implantation in the vertical direction to a depth of 3000 Å to 1 μm, e.g. 5000 Å. The doping is effected at a relatively low density, e.g. $3 \times 10^{16}$ to $5 \times 10^{18}$ cm$^{-3}$ in order to form n-type light doped source and drain 5 and 5' and 4. Then, ion implantation of boron or boron and arsenic is effected to the opposed side surfaces between the source regions 5 and 5' and the drain regions 4 in horizontal or slanting directions as depicted by arrows 38 and 38' with a suitable mask. This ion implantation may be carried out before the formation of the source regions 5 and 5' and the drain regions 4 as depicted by arrows 38 and 38' in FIG. 2(A). Also, the ion implantation may be carried out only for one of the side surfaces depending upon the application. Furthermore, the ion implantation can be carried out twice with different impurities in order to form buried channels. The impurity density (dose amount) of the ion implantation has to be selected to form the channel region in order to have desired threshold voltages. For an enhancement mode, the threshold voltage is chosen between +0.1 V and +1.0 V, e.g. +0.5 V, to obtain a normally-off structure. For a depression mode, the threshold voltage is chosen between −0.1 V and −1.0 V, e.g. −0.5 V, to obtain a normally-on structure. Of course, the signs of the voltages are inverted in the case of a p-channel structure.

The other side surfaces, as depicted by references 36 and 36' in FIG. 2(E), tends to form parasitic channels to allow leak current flowing between the drain and source regions. Ion implantation of boron or boron and arsenic is effected to these side surfaces in order to accomplish channel cutting. The doping density is selected between the density of the substrate 1 and the density of the source and the drain regions, e.g. to be $1 \times 10^{16}$ cm$^{-3}$ to $2 \times 10^{18}$ cm$^{-3}$. Since the substrate and the insulating films 33 or 2 are damaged by the ion implantation, the entire structure is annealed at a high temperature or in strong light in order to make the substrate 1 and the elevation 35 to be single crystalline.

The silicon oxide film 2 may be removed followed by forming a silicon oxide film, a silicon nitride film, a tantalum oxide film, or a multi-layered film thereof having 100 to 500 Å thickness in place of the silicon oxide film 2.

Contact holes are opened in the silicon oxide film 2 by the use of a photomask ③. After cleaning the remaining silicon oxide film, an n+-type silicon semiconductor film 7 is deposited by low pressure CVD to a thickness of 0.5 to 2.5 μm. The semiconductor film 7 is coated with a photoresist film, e.g. made of OMR-83 manufactured by TOKYO OHKA KOGYO CO., LTD. followed by patterning in order to leave a mask covering regions to be source electrodes 12 and 12' making contact with the source regions 5 and 5'. With this photoresist pattern ④, the semiconductor film 7 is subjected to an anisotropic etching. The anisotropic etching has to be carried out with no or substantially no side and taper etching. For example, the anisotropic etching is a low-temperature etching carried out at a vacuum of 0.1 to 0.001 Torr, typically 0.005 to 0.01 Torr by showering a fluorine plasma generated by chemical activation of an etchant gas such as $NF_3$ or $CF_4$ by microwave energy (2.45 GHz) upon the semiconductor film 7 in the normal direction to the substrate 1 which is given a bias voltage. Further, portions of the remaining semiconductor film 7 formed on the other side surfaces 36 and 36' are removed by etching by the use of a photomask ⑤. As a result, rectangular or nearly triangular gate electrodes 18 and 18' are formed at the side surfaces of the elevation 35 together with extention leads 38 and 38' integrally connected with the gate electrodes 18 and 18' as shown in FIG. 2(E). The etching leaves, at the same time, the source electrodes 12 and 12' connected with the source regions 5 and 5' at contacts 11 and 11' by virtue of the photomask ④ which thereafter is removed. In this case, the width of the gate electrodes 18 and 18' is determined by the thickness of the semiconductor film 7 and the anisotropical effect of the etching rather than photolithography. The width of the gate electrodes 18 and 18' at the lower ends thereof is 0.1 to 1.0 μm and the width of the extention leads 38 and 38' is 1 to 10 μm which may be connected with other circuits.

In the formation procedure of the gate electrodes 18 and 18', the n+-type semiconductor film 7 has been doped with phosphorus at $1 \times 10^{20}$ cm$^{-3}$ to $1 \times 10^{21}$ cm$^{-3}$. The doping may be carried out at the same time as the film 7 is deposited by the use of a dopant gas or after the anisotropic etching by diffusion. Alternatively, the semiconductor film can be replaced by a metal or an intermetallic compound film or a dual film of a p+-type or n+-type semiconductor layer and a metal layer or a metallic compound layer such as Mo, W, $MoSi_2$ and $WSi_2$. Finally, heavily doped regions 14, 15 and 15' are formed within the source and drain regions by ion implantation of arsenic at 30 to 150 KeV to densities of $1 \times 10^{19}$ to $1 \times 10^{21}$ cm$^{-3}$ in order to facilitate formation of ohmic contact. The ends 47 of the heavily doped regions 15 and 15' and the ends of the gate electrodes 18 and 18' are self-aligned respectively.

As a result, a pair of so called vertical-and-lateral type MIS FETs having 0.1 to 1 μpm channel length are formed in a LDD structure. The FET 10 functions as a driver while the other FET 10' functions as a loader in the structure as illustrated in FIG. 2(E). A multilayered circuit may be formed if desired by depositing and patterning an interlayer insulating film over the structure and depositing and patterning a metallic film over the insulating film by photolithography.

Figure 2F:
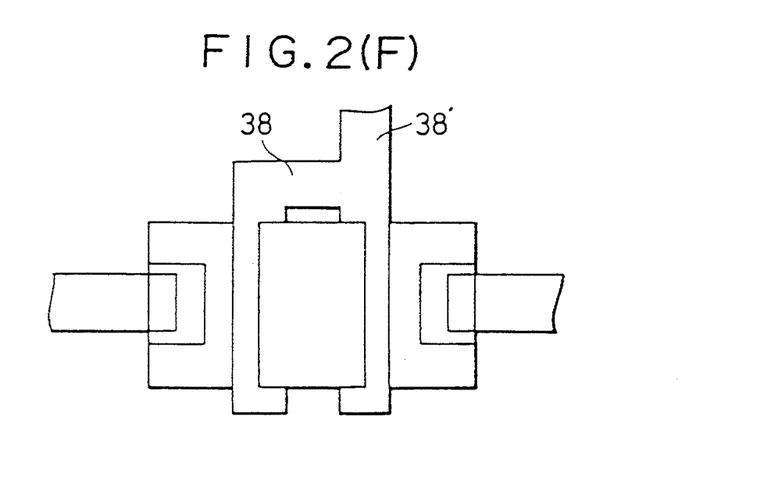
FIG. 2(F) is a plan view showing an inverter utilizing the vertical channel FETs in accordance with the present invention.

An inverter can be constructed in the same manner as the first embodiment except for the following procedures. In the step of FIG. 2(B), the ion implantation is carried out with different dose amounts in order to make the transistor 10 to operate an enhancement mode and the transistor 10' to operate a depression mode. In the step of FIG. 2(C), the etching of the remaining semiconductor film is carried out by the use of photomasks ⑤ and ⑧ in order to form connected gate electrodes as illustrated in FIG. 2(F). With this procedure, an inverter is formed with the shortened gate electrodes as its input terminal and the drain electrode 14 as its output terminal. Also, complimentary MOS FETs can be formed in LSI or VLSI structure by forming p-type channel FETs adjacent to the above described n-channel FETs and combining them. The p-channel FETs are formed in the same manner except for conductivity type.

Figure 3A:
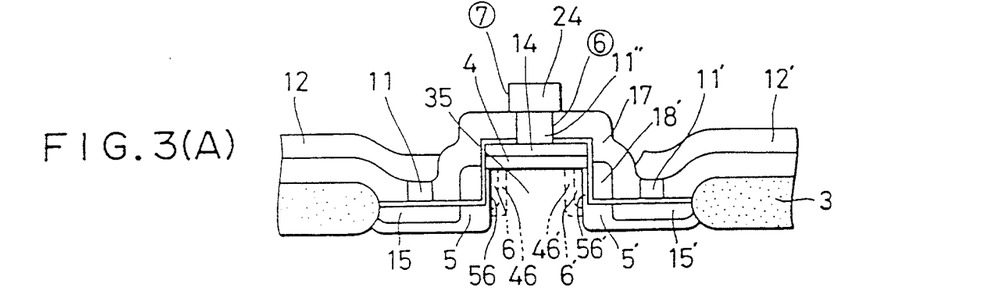
FIGS. 3(A) and 3(B) are cross sectional and plan views showing vertical channel FETs in accordance with the second embodiment of the present invention.
Figure 3B:
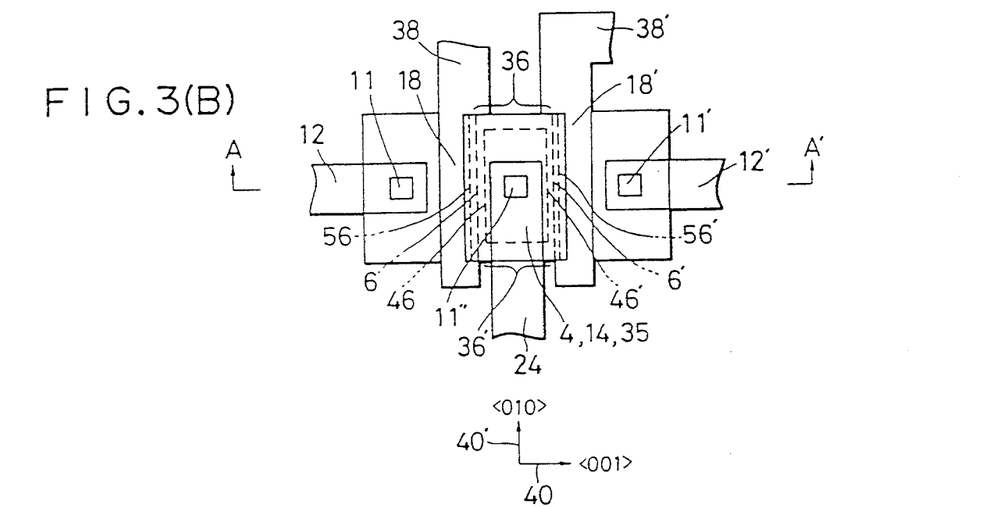
Figure 3C:
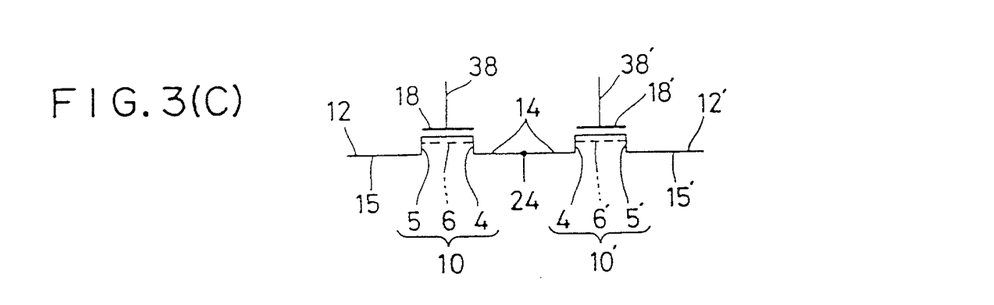
FIG. 3(C) is a circuit diagram showing an equivalent circuit of the structure as illustrated in FIGS. 3(A) and 3(B).

Referring to FIGS. 3(A) through 3(C), which illustrate a second embodiment of the invention, a pair of n-channel MIS FETs will be described. FIG. 3(A) shows the pair of FETs in a cross sectional view along A-A' line of FIG. 3(B). Most of procedures for manufacturing the FETs are same as those for the FETs as illustrated in FIGS. 2(A) to 2(E) except for the followings so that redundant explanation will be omitted.

The channel regions of the FETs are formed in a triple-layer buried structure each comprising p-type regions 56 and 56', n-type or p$^-$-type regions 46 and 46' and n-type regions 6 and 6'. The channel regions are formed by repeating ion implantation with suitable dose amounts of suitable species in slanting or lateral directions at suitable acceleration voltages. Such buried channels formed apart from the surfaces function to prevent generation of hot carriers. During the ion implantation, the other side surfaces 36 and 36' are masked by a photoresist whereas the other side surfaces 36 and 36' are doped with boron using a mask covering the side surfaces 6 and 6' for avoiding formation of parasitic p-channels on the other side surfaces. In accordance with the second embodiment, source and drain contacts 11, 11' and 11'' are formed by selective growth of tungsten in contact holes opened in an interlayer insulating film 17 made of polyimide. Finally, aluminum leads 12, 12' and 24 are formed on the insulating film 17 as source and drain electrodes making electric contact with corresponding contacts 11, 11' and 11'' respectively. A third electrode pattern may be formed in addition on the aluminum leads through a second interlayer insulating film if desired. In this case, the gate electrode 38' and the lead 12' are not connected so that the equivalent circuit diagram is written as shown in FIG. 3(C). By connecting the leads 12 and 12' with capacitors separately, a pair of stacked-type memory cell of 1Tr/cell are constructed. Such capacitances may be formed above the structure through an dielectric film over the elevation 35 and extending to the field insulating films 3.

Figure 4A:
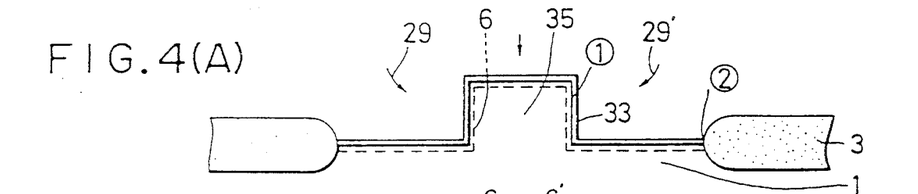
FIGS. 4(A) to 4(D) are cross sectional views showing a manufacturing method of vertical channel FETs in accordance with a third embodiment of the present invention.
Figure 4B:
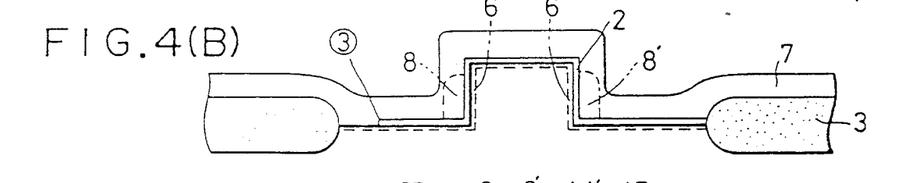
Figure 4C:
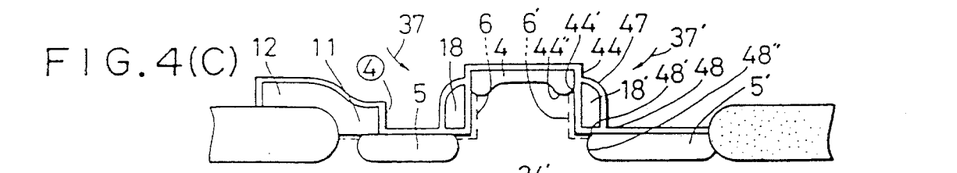
Figures 4D, 4E:
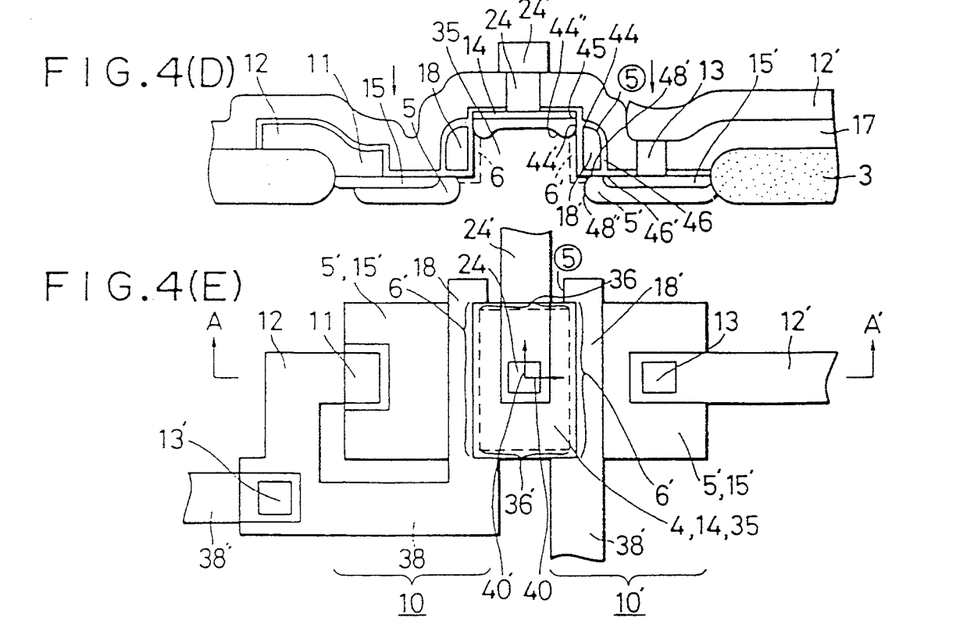
FIG. 4(E) is a plan view showing the vertical channel FETs in accordance with the third embodiment of the present invention.

Referring next to Figs. 4(A) through 4(E), which illustrate a third preferred embodiment of the invention, a manufacturing method for n-channel MIS FETs will be described. FIG. 4(D) shows a pair of completed FETs in a cross sectional view along A-A' line of FIG. 4 (E).

A single crystalline p-type silicon semiconductor of 10 to 500 Ωcm is used as a substrate 1. The orientation and dicing of the substrate has to be carried out in order that the principal surface thereof is parallel to the (100) plane of the crystalline structure. The tolerable angular displacement between the principal surface and the (100) plane is within ±10° in practice. A photoresist is formed by the use of photomask ① on the substrate 1. The surface portion of the substrate 1 is partially removed by etching with the photoresist as a mask in order to leave an elevation 35. The elevation is a parallelepiped having side surfaces parallel to the (100) and (010) planes and sharply extending downward from the edge of the upper surface thereof at 90°. For this reason, the etching has to be carried out anisotropically. The height of the elevation is 0.5 to 4 μm, for example, 1.5 μm.

The substrate 1 thus formed with the elevation 35 is coated with a silicon nitride film 33 of a thickness of about 0.1 μm. The silicon nitride film 33 can be replaced by another suitable film, capable of masking the underlying surfaces from the effects of oxidizing atmospheres, such as a silicon oxide film or a laminate film comprising a polycrystalline silicon film and a silicon nitride film. The silicon nitride film 33 is patterned by means of a second photomask ②  as illustrated in FIG. 4(A). After doping with a p-type impurity for channel cut the surface region from which the silicon nitride film is removed, a field insulating film 3 of a thickness of 0.5 to 2 μm is buried in order to define active areas therebetween. The silicon nitride film 33 is removed and a silicon oxide film 2 is formed instead.

Then, ion implantation of boron or boron and arsenic is effected to at least the opposed side surfaces 6 and 6' (FIG. 4(E)) in horizontal or slanting directions as depicted by arrows 29 and 29'. This ion implantation may be carried out after the subsequent formation of the semiconductor film 7. Also, the ion implantation may be carried out only for one of the side surfaces depending upon the application. Furthermore, the ion implantation can be carried out two or three times with different impurities in order to form buried channels. The impurity density (dose amount) of the ion implantation has to be selected to form the channel region in order to have desired threshold voltages. For an enhancement mode, the threshold voltage is chosen between $+0.1$ V and $+1.0$ V, e.g. $+0.5$ V, to obtain a normally-off structure. For a depression mode, the threshold voltage is chosen between $-0.1$ V and $-1.0$ V, e.g. $-0.5$ V, to obtain a normally-on structure. Of course, the signs of the voltages are inverted in the case of a p-channel structure.

The other side surfaces, as depicted by references 36 and 36' in FIG. 4(E), tends to form parasitic channels to allow leak current flowing between the drain and source regions. Ion implantation of boron or boron and arsenic is effected to these side surfaces in order to accomplish channel cutting. The doping density is selected between the density of the substrate 1 and the density of the source and the drain regions, e.g. to be $1 \times 10^{16}$ cm$^{-3}$ to $2 \times 10^{18}$ cm$^{-3}$. Since the substrate and the insulating films 33 or 2 are damaged by the ion implantation, the entire structure is annealed at a high temperature or in strong light in order to make the substrate 1 and the elevation 35 to be single crystalline.

Contact holes are opened in the silicon oxide film 2 by the use of a photomask ③. After cleaning the remaining silicon oxide film, an n$^+$-type silicon semiconductor film 7 is deposited by low pressure CVD to a thickness of 0.5 to 2.5 μm. The semiconductor film 7 is coated with a photoresist film, e.g. made of OMR-83 manufactured by TOKYO OHKA KOGYO CO., LTD. followed by patterning in order to leave a mask covering regions to be a source electrode 12 making contact with the source region 5. With this photoresist pattern, the semiconductor film 7 is subjected to an anisotropic etching. The anisotropic etching has to be carried out with no or substantially no side and taper etching. For example, the anisotropic etching is a low-temperature etching carried out at a vacuum of 0.1 to 0.001 Torr, typically 0.005 to 0.01 Torr by showering a fluorine plasma generated by chemical activation of an etchant gas such as NF$_3$ or CF$_4$ by microwave energy (2.45 GHz) upon the semiconductor film 7 in the normal direction to the substrate 1 which is given a bias voltage. Further, portions of the remaining semiconductor film 7 formed on the other side surfaces 36 and 36' are removed by etching by the use of a photomask ⑤. As a result, rectangular or nearly triangular gate electrodes 18 and 18' are formed at the side surfaces of the elevation 35 together with extention leads 38 and 38' integrally connected with the gate electrodes 18 and 18' as shown in FIG. 4(E). The etching leaves, at the same time, the source electrode 12 connected with the source region 5 at a contact 11 and the extension 38 by virtue of the photomask ④ which thereafter is removed. In this case, the width of the gate electrodes 18 and 18' is determined by the thickness of the semiconductor film 7 and the anisotropical effect of the etching rather than photolithography. The width of the gate electrodes 18 and 18' at the lower ends thereof is 0.1 to 1.0 μm and the width of the extention leads 38 and 38' is 1 to 10 μm which may be connected with other circuits.

In the formation procedure of the gate electrodes 18 and 18', the n$^+$-type semiconductor film 7 has been doped with phosphorus at $1 \times 10^{20}$ cm$^{-3}$ to $1 \times 10^{21}$ cm$^{-3}$. The doping may be carried out at the same time as the film 7 is deposited by the use of a dopant gas or after the anisotropic etching by diffusion. Alternatively, the semiconductor film can be replaced by a metal or an intermetallic compound film or a dual film of a p$^+$-type or n$^+$-type semiconductor layer and a metal layer or a metallic compound layer such as Mo, W, MoSi$_2$ and WSi$_2$.

The upper entire surface of the structure is oxidized to form a silicon oxide film 47 to a thickness of 300 to 2000 Å. Arsenic or phosphorus is introduced into the substrate by ion implantation with the gate electrodes 18 and 18' with reference to the normal of the substrate 1 as a mask in slanting directions, e.g. at angles of ±30° to ±60° as depicted by arrows 37 and 37' to a depth of 3000 Å to 1 μm, e.g. 5000 Å by an acceleration voltage of 30 to 100 KeV. The doping is effected at a relatively low density, e.g. $5 \times 10^{14}$ to $5 \times 10^{15}$ cm$^{-3}$ in order to form n-type light doped source and drain regions 5 and 5' and 4. The drain region 4 terminates in the side surfaces 6 and 6' and self-aligned to the upper ends 44 of the gate electrodes 18 and 18' as shown by reference 44' and a pair of source regions 5 and 5' self-aligned to the outer ends of the electrodes 18 and 18'. The depth of the drain region 4 is increased at positions 44" a certain distance from the surfaces 6 and 6'. The source regions 5 and 5' are extended in the same manner into the inside of the substrate just below the gate electrodes 18 and 18' as depicted by reference 48". The inner extensions 48" and 44" are determined by the slanting angles of the ion implantation.

Then, heavily doped regions 14, 15 and 15' are formed within the source and drain regions by ion implantation of arsenic at 30 to 150 KeV to densities of $1 \times 10^{19}$ to $1 \times 10^{21}$ cm$^{-3}$ in order to facilitate formation of ohmic contact. The ends 46' of the heavily doped regions 15 and 15' and the ends of the gate electrodes 18 and 18' are self-aligned respectively. These heavily doped regions may be formed at the same time as the lightly doped regions 4, 5 and 5' by changing the condition of the ion implantation with a smaller dose amount at a higher acceleration voltage, e.g. initially $1 \times 10^{14}$ cm$^{-2}$ at 100 KeV, next $3 \times 10^{14}$ cm$^{-2}$ at 50 KeV and finally $2 \times 10^{14}$ cm$^{-2}$ at 30 KeV.

The structure is coated with a 0.1 to 1.0 μm thick interlayer insulating film 17 over the structure followed by opening contact holes above the drain and source regions 14, 15 and 15'. Drain and source electrodes 24 and 13 and 13' are formed in the contact holes by selective growth of tungsten. Finally, drain and source electrodes 24', 12' and 38' are formed from aluminum in contact with the drain and source regions.

As a result, a pair of so called vertical-and-lateral type MIS FETs having 0.1 to 1 μm channel length are formed in a LDD structure. The FET 10' functions as a driver while the other FET 10 functions as a loader in the structure as illustrated in FIG. 4(E). A multilayered circuit may be formed if desired by depositing and patterning an interlayer insulating film over the structure and depositing and patterning a metallic film over the insulating film by photolithography.

Figure 5A:
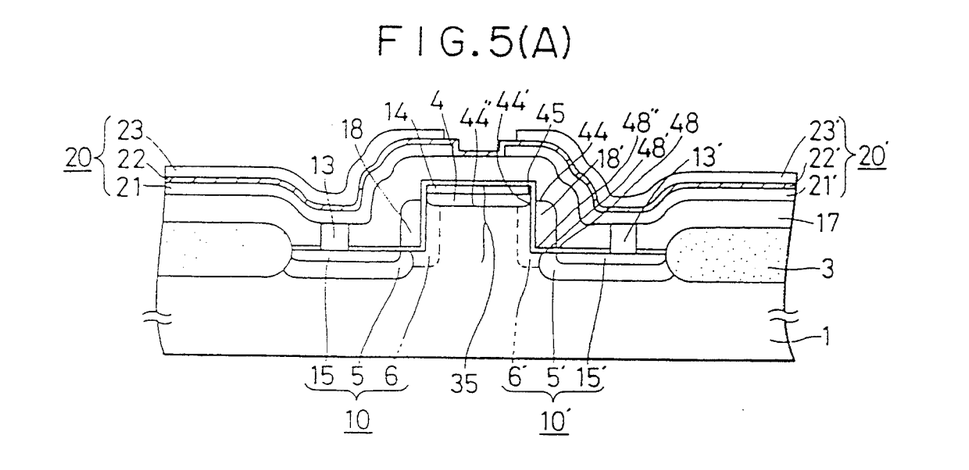
FIGS. 5(A) and 5(B) are cross sectional views showing vertical channel FETs in accordance with fourth and fifth embodiments of the present invention.

Referring to FIG. 5(A), which illustrates a fourth embodiment of the invention, a pair of n-channel MIS FETs will be described. FIG. 5(A) shows the pair of FETs in cross section. Many steps for manufacturing the FETs are same as those for the FETs as illustrated in FIGS. 4(A) to 4(E) except for the followings so that redundant explanation will be omitted.

Figure 5B:
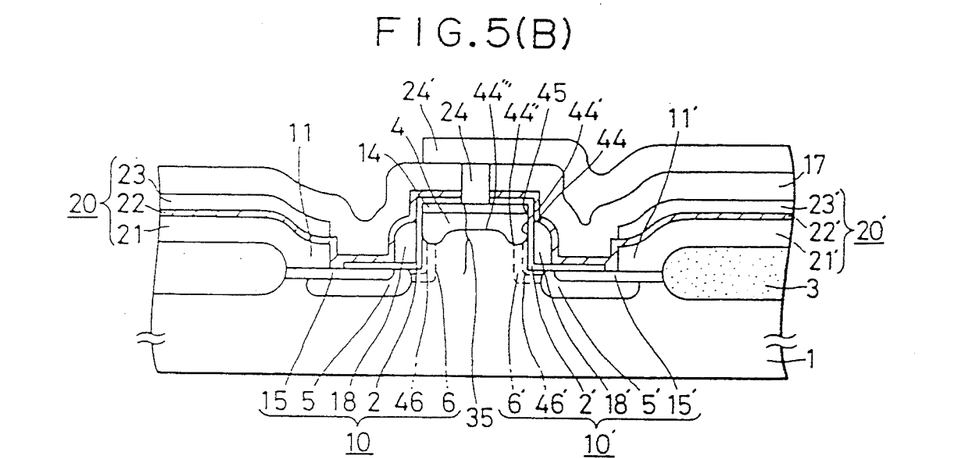
Figure 5C:
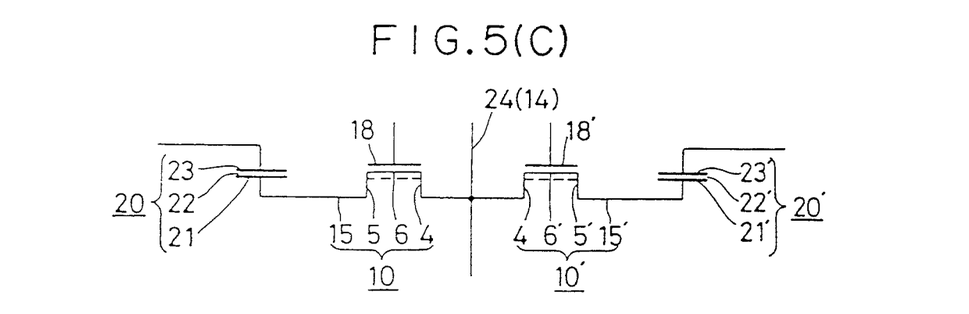
FIG. 5(C) is a circuit diagram showing an equivalent circuit of the storage elements illustrated in FIGS. 5(A) and 5(B).

The pair of FETs are provided with a pair of capacitances respectively in order to constitute a unit of a 1 Tr/cell stacked-type memory capable of storing two bits of information as illustrated in FIG. 5(C). The capacitance comprises a first electrode 21(21') made of tungsten silicide, a dielectric film 22(22') and a second electrode 23(23') made of aluminum. The dielectric film is made of an material having a high dielectric constant such as tantalum oxide, titanium oxide, silicon nitride and barium titanate. The tungsten silicide electrodes 21 and 21' can make good ohmic contact with the tungsten contacts 13 and 13' which have been grown by selective growth. By forming a large number of such a structure on the substrate 1, a stacked memory device having a high packing density is constructed with the drain 14 as a bit line and the gate 18(18') as a word line.

Referring to FIG. 5(B), which illustrates a fifth embodiment of the invention, a pair of n-channel MIS FETs will be described. FIG. 5(B) shows the pair of FETs in cross section. Many steps for manufacturing the FETs are same as those for the FETs as illustrated in FIGS. 4(A) to 4(E) except for the followings so that redundant explanation will be omitted.

The pair of FETs are provided with a pair of capacitances respectively in order to constitute a unit of a 1 Tr/cell stacked-type memory capable of storing two bits of information as illustrated in FIG. 5(C) in the same manner as the fourth embodiment. The capacitance comprises a 0.1 to 1.0 $\mu$m thick first electrode 21(21') made of a silicon semiconductor heavily doped with phosphorus, a dielectric film 22(22') and a second electrode 23(23') made of a metal or a semiconductor. The dielectric film is made of tantalum oxide, titanium oxide, silicon nitride or barium titanate film of 100 to 500 Å thickness. The silicon semiconductor electrodes 21 and 21' are deposited in direct contact with the heavily doped source regions 15 and 15' at contacts 11 and 11'. . . .

The channel regions of the FETs are formed in a dual layer buried structure each comprising p-type regions 46 and 46' doped with boron and n-type regions 6 and 6' doped with arsenic. The channel regions are formed by repeating ion implantation with suitable dose amounts of suitable species in slanting or lateral directions at suitable acceleration voltages.

The drain region 14 is provided with a drain lead 24' making electric contact with the region 14 through a drain contact 24 which is formed by selective growth of tungsten in a contact hole opened in a 0.1 to 1.0 $\mu$m thick interlayer insulating film 17 in the same manner as the third embodiment. By forming a large number of such a structure on the substrate 1, a stacked memory device having a high packing density is constructed with the drain 14 as a bit line and the gate 18(18') as a word line.

Figure 6A:
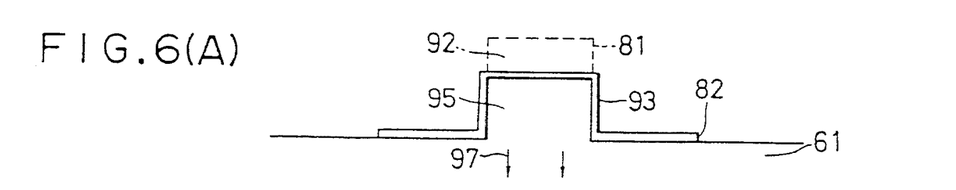
FIGS. 6(A) to 6(D) are cross sectional views showing a manufacturing method of vertical channel FETs in accordance with a sixth embodiment of the present invention.
Figure 6B:
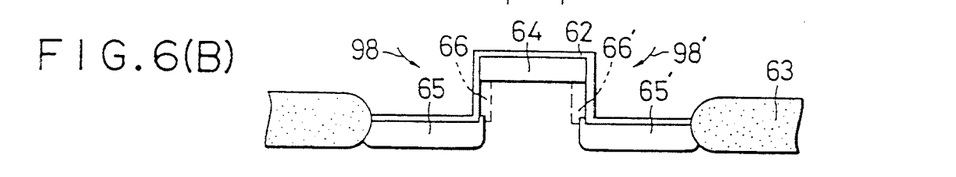
Figure 6C:
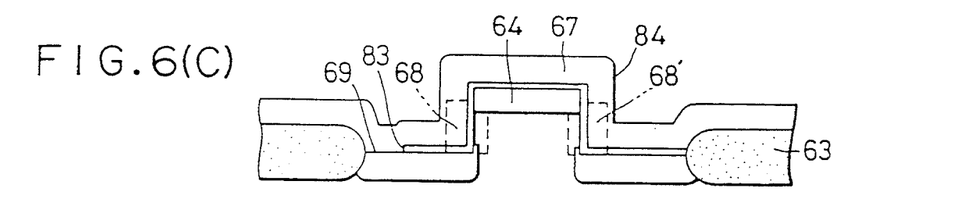
Figure 6D:
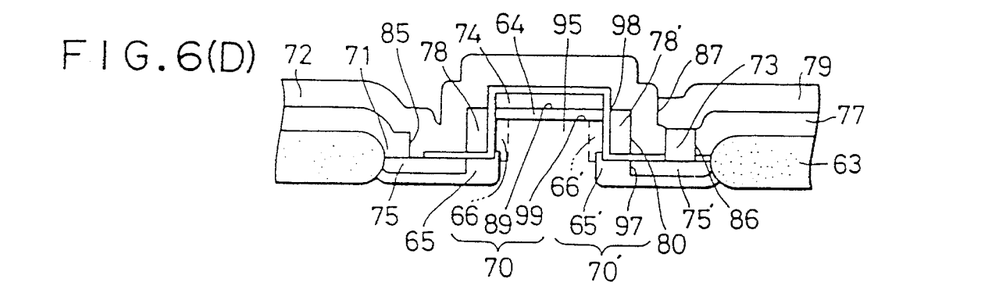
Figure 6E:
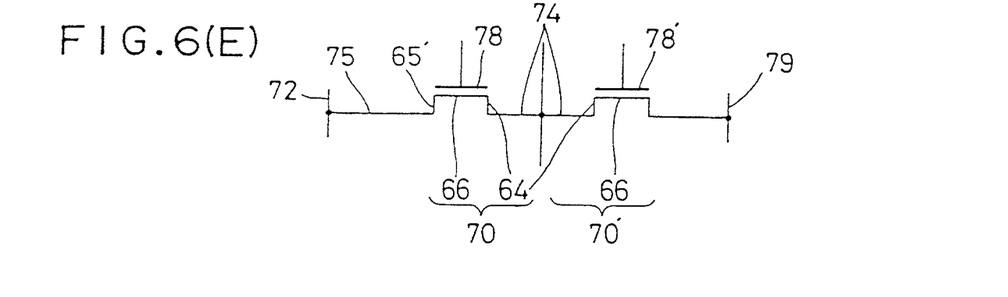
FIG. 6(E) is a circuit diagram showing an equivalent circuit of the elements in accordance with the sixth embodiment of the present invention.

Referring now to FIGS. 6(A) to 6(D), which illustrate a sixth preferred embodiment of the invention, a manufacturing method for n-channel MIS FETs will be described. FIG. 6(E) shows a circuit diagram showing an equivalent circuit of the elements illustrated in FIGS. 6(A) to 6(D).

A single crystalline p-type silicon semiconductor of 10 to 500 $\Omega$cm is used as a substrate 61. The orientation and dicing of the substrate have to be carried out in order that the principal surface thereof is parallel to the (100) plane of the crystalline structure. The tolerable angular displacement between the principal surface and the (100) plane is within $\pm$10° in practice. A photoresist 92 is formed by the use of photomask 81 on the substrate 61. The surface portion of the substrate 61 is partially removed by etching with the photoresist 92 as a mask in order to leave an elevation 95. The elevation has side surfaces sharply extending downward from the edge of the upper surface thereof at 90°. For this reason, the etching has to be carried out anisotropically. The height of the elevation is 0.5 to 4 $\mu$m, for example, 1.5 $\mu$m.

The substrate 61 formed with the elevation 95 is coated with a silicon nitride film 93 of a thickness of about 0.1 $\mu$m. The silicon nitride film 93 can be replaced by another suitable film, capable of masking the underlying surfaces from the effects of oxidizing atmospheres, such as a silicon oxide film or a laminate film comprising a polycrystalline silicon film and a silicon nitride film. The silicon nitride film 93 is patterned by means of a second photomask 82 as illustrated in FIG. 6(A). After doping with a p-type impurity for channel cut the surface region from which the silicon nitride film is removed, a field insulating film 63 of a thickness of 0.5 to 2 $\mu$m is buried in order to define active areas therebetween. The silicon nitride film 93 is removed and a silicon oxide film 62 is formed instead.

Arsenic or phosphorus is introduced into the substrate by ion implantation in the vertical direction to a depth of 3000 Å to 1 $\mu$m, e.g. 5000 Å. The doping is effected at a relatively low density, e.g. $3 \times 10^{16}$ to $5 \times 10^{18}$ cm$^{-3}$ in order to form n-type light doped source and drain 65 and 65' and 64. Then, ion implantation of boron is effected to the opposed side surfaces of the elevation 95 in horizontal or slanting directions with a suitable mask. The impurity density (dose amount) of the ion implantation has to be selected to form the channel region in order to have desired threshold voltages.

Since the substrate and the insulating films 93 or 62 are damaged by the ion implantation, the entire structure is annealed at a high temperature or in strong light in order to make the substrate 61 and the elevation 95 to be single crystalline.

The silicon oxide film 62 may be removed followed by forming a silicon oxide film, a silicon nitride film, a tantalum oxide film, or a multi-layered film thereof having 100 to 500 Å thickness in place of the silicon oxide film 62.

Contact holes are opened in the silicon oxide film 62 by the use of a photomask 83. After cleaning the remaining silicon oxide film, an n+-type silicon semiconductor film 67 is deposited by low pressure CVD to a thickness of 0.5 to 2.5 $\mu$m. The semiconductor film 67 is coated with a photoresist film, e.g. made of OMR-83 manufactured by TOKYO OHKA KOGYO CO., LTD. followed by patterning in order to leave a mask covering a region to be a lead and a source electrode 71 making contact with the source region 65. With this photoresist pattern, the semiconductor film 67 is subjected to an anisotropic etching. The anisotropic etching has to be carried out with no or substantially no side and taper etching. For example, the anisotropic etching is a low-temperature etching carried out at a vacuum of 0.1 to 0.001 Torr, typically 0.005 to 0.01 Torr by showering a fluorine plasma generated by chemical activation of an etchant gas such as $NF_3$ or $CF_4$ by microwave energy (2.45 GHz) upon the semiconductor film 67 in the normal direction to the substrate 61 which is given a bias voltage. Further, portions of the remaining semiconductor film 67 formed on the other side surfaces are removed by etching in the same manner as in the first embodiment. As a result, rectangular or nearly triangular gate electrodes 78 and 78' are formed at the side surfaces of the elevation 95. The etching leaves, at the same time, the source electrode 71 connected with the source region 65 by virtue of the photoresist pattern 85 which thereafter is removed. In this case, the width of the gate electrodes 78 and 78' is determined by the thickness of the semiconductor film 67 and the anisotropical effect of the etching rather than photolithography. The width of the gate electrodes 78 and 78' at the lower ends thereof is 0.05 to 1.5 μm, typically 0.2 to 1.0 μm. The gate electrodes 78 and 78' may extend on field insulating layers as electrical leads having a width of 1 to 10 μm. These leads can be electrically connected to other MIS FETs, capacitors, or resistances formed on the substrate 61.

In the formation procedure of the gate electrodes 78 and 78', the n+-type semiconductor film 67 has been doped with phosphorus at $1 \times 10^{20}$ cm$^{-3}$ to $1 \times 10^{21}$ cm$^{-3}$. The doping may be carried out at the same time as the film 67 is deposited by the use of a dopant gas or after the anisotropic etching by diffusion. Alternatively, the semiconductor film can be replaced by a metal or an intermetallic compound film or a dual film of a p+-type or n+-type semiconductor layer and a metal layer or a metallic compound layer such as Mo, W, $MoSi_2$ and $WSi_2$.

Next, heavily doped regions 74, 75 and 75' are formed within the source and drain regions by ion implantation of arsenic at 30 to 150 KeV to densities of $1 \times 10^{19}$ to $1 \times 10^{21}$ cm$^{-3}$ with the gate electrodes 78 and 78' as a mask in order to facilitate formation of ohmic contact. The ends 97 of the heavily doped regions 75 and 75' and the ends 80 of the gate electrodes 78 and 78' are self-aligned respectively. It is preferred that the ends 98 of the gate electrodes 78 and 78' are at a level between the end 99 of the region 64 and the end 89 thereof. Next, an insulating film is formed and an opening 73 is formed in the insulating film to leave insulating layers 72 and 77. An electrode 73 is formed in the opening and an electrical lead 79 is formed on the insulating layer 77 and the electrode 73.

As a result, a pair of so called vertical-and-lateral type MIS FETs having 0.05 to 1 μm channel length are formed in a LDD structure. The FET 70' may function as a driver while the other FET 70 may function as a loader in the structure. A multilayered circuit may be formed if desired by depositing and patterning an interlayer insulating film made of polyimide, for example PIQ, over the structure and depositing and patterning a metallic film over the insulating film by photolithography.

Also, FETs can be formed in LSI or VLSI structure by providing field insulating films between the FETs.

Figure 7A:
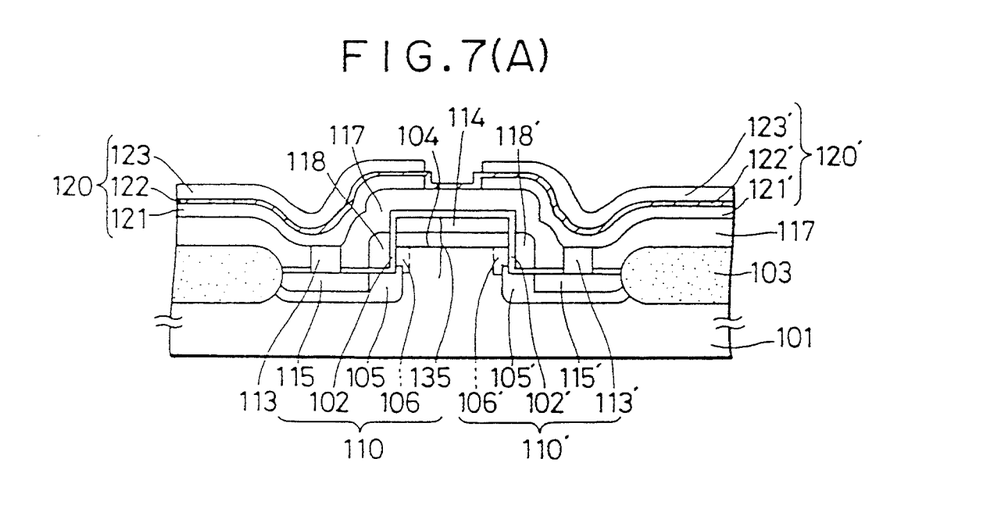
FIGS. 7(A) and 7(B) are cross sectional views showing vertical channel FETs in accordance with seventh and eighth embodiments of the present invention.

Referring now to FIG. 7(A), a semiconductor device comprising a MIS FET 110 connected to a capacitor 120 in series and a MIS FET 110' connected to a capacitor 120' in series in accordance with a seventh preferred embodiment of the invention will be described.

The semiconductor device comprises channel regions 106 and 106', a source or drain 104, and a heavily doped second impurity region 114 provided in an elevation 135 of a semiconductor substrate 101. The semiconductor device further comprises field insulating layers 103, N+-type first impurity regions 115 and 115', a drain or source 105, and a drain or source 105' provided in the substrate 101. The semiconductor device still further comprises a gate insulating film 102, 102' provided on the substrate and gate electrodes 118 and 118' provided on the gate insulating film.

The first impurity region 115 is connected to a lower electrode 121 of the capacitor 120 through an electrode 113 and a dielectric film 122 of the capacitor 120 is provided on the lower electrode 121 and an upper electrode 123 of the capacitor 120 is provided on the dielectric film 122. The first impurity region 115' is connected to a lower electrode 121' of the capacitor 120' through an electrode 113' and a dielectric film 122' of the capacitor 120' is provided on the lower electrode 121' and an upper electrode 123' of the capacitor 120' is provided on the dielectric film 122'.

The second impurity region 114 is connected to a bit line and the gate electrodes 118 and 118' are connected to word lines, The dielectric films 122 and 122' may be films having a large dielectric constant, for example an tantalum oxide film, a titanium oxide film, a silicon nitride film, a barium titanate film, or a multi-layer thereof.

The gate electrodes 118 and 118' are insulated by an oxide interlayer insulating film 117. The electrodes 113 and 113' are tungsten electrodes formed by selective growth. The lower electrodes 121 and 121' are tungsten silicide electrodes.

The formation of the semiconductor device is carried out in accordance with the sixth preferred embodiment except for the formation described in the seventh preferred embodiment.

Figure 7B:
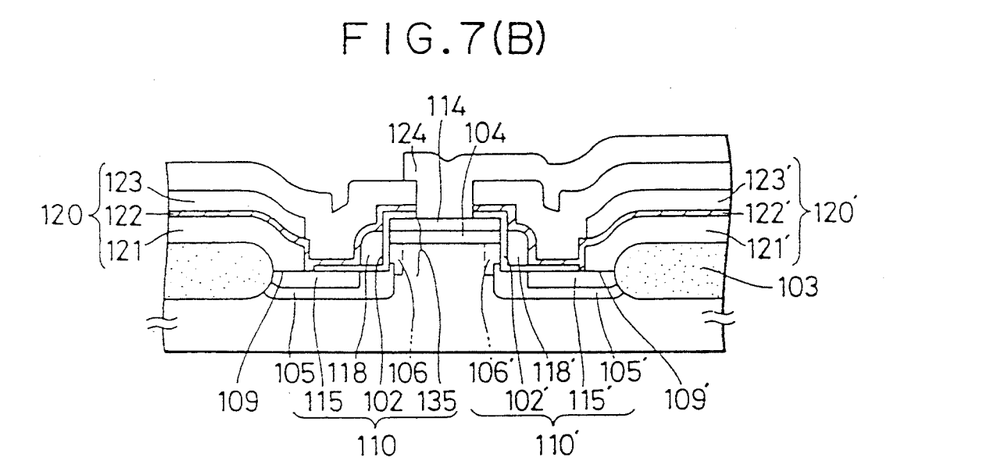
Figure 7C:
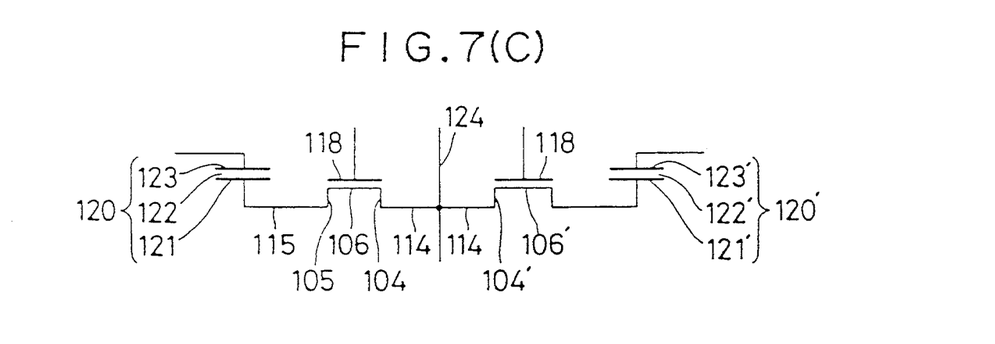
FIG. 7(C) is a circuit diagram showing an equivalent circuit of the elements illustrated in FIGS. 7(A) and 7(B).

Refereeing now to FIG. 7(B), a semiconductor device comprising a MIS FET 110 connected to a capacitor 120 in series and a MIS FET 110' connected to a capacitor 120' in series in accordance with an eighth preferred embodiment of the invention will be described.

An elevation 135 made of single crystal semiconductor is coated with gate insulating films 102, 102' and gate electrodes 118 and 118' are formed on the gate insulating films.

Light doped source and drain 104, 105, and 105' are provided in order to control channel lengths 106 and 106' accurately. Ion implantation is carried out in order to obtain heavily doped first impurity regions 115 and 115' and a heavily doped second impurity region 114 by self-align process with the gate electrodes as masks. Lower electrodes 121 and 121' of capacitors 120 and 120', for example doped silicon electrodes, are formed to a thickness of 0.1 to 1 μm. The lower electrodes 121 and 121' are connected to the first impurity regions 115 and 115' through contact holes 109 and 109'.

Tantalum oxide films 122 and 122' are formed on the lower electrodes to a thickness of 100 to 500 Å by sputtering as dielectric films of the capacitors 120 and 120'.

Upper electrodes 123 and 123' of the capacitors are formed on the tantalum oxide films by forming a metal or semiconductor film thereof and patterning the metal or semiconductor film by photo etching. Thus stacked type memory cell is obtained. A multi-layer electrical lead 124 is formed as a word line on an interlayer insulating film.

The lead 124 is connected to the second impurity region 114 through a contact. The gate electrodes 118 and 118' are connected to bit lines.

Alternatively, the lead 124 can be used as a bit line and the gate electrodes 118 and 118' can be connected to word lines.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Some examples of such modifications are as follows:

When the gate electrodes are formed on the sides of the elevation by anisotropical etching, the extentions thereof can be left at the same time crossing over the field insulating film in order to make electrical connection with MIS FETs, capacitors, resistors or other electric devices formed within adjacent active regions of the same semiconductor chip. Although the conductivity type of the embodiments described above is specified as n-type, p-type transistors are formed in the same manner without substantial change, e.g. only by inverting the conductivity types of the respective semiconductor regions. Also the source and drain regions in the figures are interchangeable depending upon the application or the conductivity type.

What is claimed is:

1. A method of manufacturing a pair of gate insulated field effect transistors comprising:
    forming a rectangular parallelepiped single crystalline elevation on a single crystalline semiconductor substrate in order that said parallelepiped elevation has a pair of first parallel side surfaces and a pair of second parallel side surfaces, the orientation of said first parallel side surfaces being substantially in the (100) plane or an equivalent plane of the crystalline structure of said elevation;
    forming a pair of gate electrodes on said first side surfaces with a pair of gate insulating film therebetween by forming said insulating film on said substrate and said elevation and depositing a conductive film on said insulating film over said elevation and removing portions of said conductive film from surfaces parallel to said substrate by anisotropic etching; and
    forming a pair of first impurity regions of a first conductivity type within said semiconductor substrate, said first impurity regions being located respectively just below said gate electrodes and a second impurity region of said first conductivity type located at an upper portion of said elevation in order to define a pair of channel regions between said first impurity regions and said second impurity region.

2. The method of manufacturing a pair of field effect transistors as claimed in claim 1 wherein said elevation forming step is carried out by partially removing the surface portion of said substrate in order to remain said elevation.

3. The method of manufacturing a pair of field effect transistors as claimed in claim 1 further comprising a step of adjusting the threshold voltage by appropriately introducing at least one impurity into said channel region.

4. The method of manufacturing a pair of field effect transistors as claimed in claim 3 wherein said introduction is carried out by ion implantation in a slanting direction with respect to the substrate.

5. The method of manufacturing a pair of field effect transistors as claimed in claim 1 wherein said second side surfaces are doped with an impurity in order to prevent undesirable current leakage therethrough.

6. The method of manufacturing a pair of field effect transistors as claimed in claim 1 wherein said etching is a plasma etching utilizing an etchant gas made active by microwave energy.

7. The method of manufacturing a pair of field effect transistors as claimed in claim 6 wherein said etchant gas is a gas selected from the group consisting of nitrogen fluoride and carbon fluoride.

8. The method of manufacturing a pair of field effect transistors as claimed in claim 6 wherein said substrate is biased.

9. The method of manufacturing a pair of field effect transistors as claimed in claim 1 wherein said first and second impurity regions are formed by ion implantation effected in a slanting direction with respect to said substrate.

10. The method of manufacturing a pair of field effect transistors as claimed in claim 9 wherein said slanting direction makes 30° to 60° with the normal of said substrate.

11. A method of manufacturing a pair of insulated gate field effect transistors comprising:
    forming an elevation on a semiconductor substrate;
    forming a pair of gate electrodes on the side surfaces of said elevation with a pair of gate insulating films therebetween by forming an insulating film on said substrate and said elevation and forming a conductive film on said insulating film over said elevation and removing portions of said conductive film from surfaces parallel to said substrate by anisotropic etching;
    forming a pair of first impurity regions of a first conductivity type within said semiconductor substrate, said first impurity regions being located respectively just below said gate electrodes and a second impurity region of said first conductivity type located at an upper portion of said elevation in order to define a pair of channel regions between said first impurity regions and said second impurity region; and
    forming in said semiconductor substrate a pair of third impurity regions of said first conductivity type having a density higher than that of said first impurity regions for contact with a pair of electrodes and on said second impurity region a fourth impurity region of said first conductivity type having a density higher than that of said second impurity region for contact with an electrode by ion implantation with said gate electrodes as masks.

12. The method of claim 11 wherein said elevation forming step is carried out by partially removing the surface portion of said substrate in order to remain said elevation.

13. A method of manufacturing an insulated gate field effect transistor comprising:
preparing a single crystalline semiconductor substrate;
anisotropically etching a portion of said single crystalline semiconductor substrate in order to form a semiconductor island elevated from an upper surface of said semiconductor substrate in such a manner that said semiconductor island has at least one side surface having a crystalline orientation (100);
forming an insulating layer on at least said side surface;
forming a gate electrode on said semiconductor substrate adjacent to said side surface with said insulating layer interposed therebetween; and
inputting a dopant impurity to an upper portion of said semiconductor island and a portion of said semiconductor substrate with said gate electrode as a mask, thereby defining a channel region within said semiconductor island along said side surface of said semiconductor island.

14. A method of manufacturing an insulated gate field effect transistor comprising:
preparing a semiconductor substrate having a semiconductor island protruded from an upper surface of said substrate, said semiconductor island having at least one side surface;
forming a gate insulating layer on at least said side surface of said island;
forming a conductive layer on said semiconductor substrate including said semiconductor island;
anisotropically etching said conductive layer in order to leave at least a gate electrode adjacent to aid side surface of the semiconductor island; and
forming a pair of impurity regions in an upper portion of said semiconductor island and a portion of said semiconductor substrate adjacent to said gate electrode by introducing a dopant impurity thereto by an ion implantation method;
wherein a depth of said impurity region in said upper portion of the semiconductor island is determined by an energy of the ion implantation and a location of the impurity region in said semiconductor substrate is determined by said gate electrode.

15. A method of manufacturing an insulated gate field effect transistor comprising:
preparing a semiconductor substrate having a semiconductor island protruded from an upper surface of said substrate, said semiconductor island having at least one side surface;
forming an insulating layer on at least said side surface of said island and a portion of said semiconductor substrate;
forming at least one contact hole through said insulating layer on a portion of said semiconductor substrate corresponding to at least one of source or drain regions;
forming a conductive layer on said semiconductor substrate to cover said insulating layer;
anisotropically etching said conductive layer in order to leave at least a gate electrode adjacent to aid side surface of the semiconductor island and at least one wiring connected to said substrate through a contact hole provided in said insulating layer; and
forming a pair of impurity regions in an upper portion of said semiconductor island and a portion of said semiconductor substrate adjacent to said gate electrode by adding a dopant impurity to an upper portion of said semiconductor island and a portion of said semiconductor substrate.

16. A method of manufacturing an insulated gate field effect transistor comprising:
preparing a semiconductor substrate having a semiconductor island elevated from an upper surface of said substrate;
forming an insulating film on at least a side surface of said semiconductor island;
forming a pair of lightly doped regions in an upper portion of said semiconductor island and a portion of said semiconductor substrate adjacent to said side surface of the semiconductor island;
forming gate electrode on said substrate adjacent to said side surface with said insulating film interposed therebetween; and then
forming a pair of heavily doped regions in said pair of lightly doped regions,
wherein the heavily doped regions formed in the portion of said semiconductor substrate has a side edge substantially aligned with said gate electrode.

17. A method of manufacturing an insulated gate field effect transistor comprising the steps of:
preparing a semiconductor substrate having a semiconductor elevation protruded from an upper surface of said substrate, said elevation having at least one side surface vertical to said upper surface of the substrate;
forming an insulating film on at least said side surface of said semiconductor island;
forming a gate electrode on said substrate adjacent to said side surface with said insulating film interposed therebetween;
forming a pair of lightly doped regions in an upper portion of said elevation and a portion of said gate electrode by introducing an impurity in a slanting direction with respect to said upper surface of the substrate so that one of said lightly doped regions extends under said gate electrode at least partly; and then
forming a pair of heavily doped regions in said lightly doped regions by introducing an impurity in a direction perpendicular to said upper surface of the substrate.

* * * * *